US012712370B2

(12) United States Patent
Park

(10) Patent No.: US 12,712,370 B2
(45) Date of Patent: Aug. 18, 2026

(54) BATTERY MANAGEMENT SYSTEM AND METHOD OF MANAGING BATTERY USING THE SAME

(71) Applicant: HYUNDAI MOBIS CO., LTD., Seoul (KR)

(72) Inventor: Hoyoung Park, Anyang-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 800 days.

(21) Appl. No.: 17/991,185

(22) Filed: Nov. 21, 2022

(65) Prior Publication Data

US 2023/0163606 A1 May 25, 2023

(30) Foreign Application Priority Data

Nov. 24, 2021 (KR) ........................ 10-2021-0163833

(51) Int. Cl.
*H02J 7/64* (2026.01)
*G01R 31/367* (2019.01)
(Continued)

(52) U.S. Cl.
CPC .............. *H02J 7/64* (2026.01); *G01R 31/367* (2019.01); *G01R 31/3835* (2019.01);
(Continued)

(58) Field of Classification Search
CPC .......... H02J 7/34; H02J 7/0029; H02J 7/0016; H02J 7/00308; H02J 7/00306; H02J 7/0068; H02J 7/0048; H02J 7/0014; H02J 7/0031; H02J 7/345; H02J 7/0047; H02J 7/1423; H02J 7/342; H02J 7/24; H02J 7/00302; H02J 7/35; H02J 7/0063; H02J 7/0036;
(Continued)

(56) References Cited

U.S. PATENT DOCUMENTS 9,893,385 B1 * 2/2018 Nayar ................ H01M 10/399
2008/0088279 A1 * 4/2008 Lim ......................... H02J 7/54
320/134

(Continued)

FOREIGN PATENT DOCUMENTS

KR 10-2008-0034352 A 4/2008
KR 10-2021-0069916 A 6/2021

OTHER PUBLICATIONS

Office Action issued on Mar. 25, 2026 in Korean Patent Application No. 10-2021-0163833.

*Primary Examiner* — Binh C Tat
(74) *Attorney, Agent, or Firm* — Morgan, Lewis & Bockius LLP

(57) ABSTRACT

Provided is a battery management system. The battery management system includes: a battery management system (BMS) monitoring a battery, turning on/off a main relay connected to an output of the battery, and receiving power through a power switch; a sensor unit measuring a state of the battery to generate battery state information; and a controller configured to receive the battery state information from the sensor unit, detect an occurrence of a failure event of the battery based on the battery state information, control the main relay based on a maintenance time of the failure event and the number of times of the occurrence of the failure event, and provide a turn on/off command to the power switch.

15 Claims, 2 Drawing Sheets

(51) Int. Cl.

| | |
|---|---|
| ***G01R 31/3835*** | (2019.01) |
| ***G01R 31/392*** | (2019.01) |
| ***H01M 10/42*** | (2006.01) |
| ***H01M 10/48*** | (2006.01) |
| ***H02J 7/65*** | (2026.01) |
| ***H02J 7/80*** | (2026.01) |

(52) U.S. Cl.
CPC ........ *G01R 31/392* (2019.01); *H01M 10/425* (2013.01); *H01M 10/48* (2013.01); *H01M 10/486* (2013.01); *H02J 7/65* (2026.01); *H02J 7/80* (2026.01); *H01M 2010/4271* (2013.01)

(58) Field of Classification Search
CPC ........ H02J 7/007; H02J 7/007194; H02J 7/04; H02J 7/00; H02J 7/00036; H02J 7/0013; H02J 7/00304; H02J 7/00309; H02J 7/00712; H02J 7/02; H02J 7/1492; H02J 7/60; H02J 7/54; H02J 7/64; H02J 7/82; H02J 7/52; H02J 7/63; H02J 7/84; H02J 7/865; H02J 7/663; H02J 9/061; H02J 13/1323; H02J 7/70; H02J 7/80; H02J 7/61; H02J 7/855; H02J 7/50; H02J 7/65; H02J 7/685; H02J 7/90; H02J 7/933; H02J 7/977; H02J 7/44; H02J 7/575; H02J 7/62; G01R 31/396; G01R 31/382; G01R 31/3646; G01R 31/367; G01R 31/3835; G01R 31/392; G01R 19/16542; G01R 31/386
USPC .................................................. 320/127–134
See application file for complete search history.

(56) References Cited

U.S. PATENT DOCUMENTS

2009/0195217 A1* 8/2009 Choi .................... B60W 20/13
320/152
2017/0264123 A1* 9/2017 Mulawski ................. H02J 7/52

* cited by examiner

BATTERY MANAGEMENT SYSTEM AND METHOD OF MANAGING BATTERY USING THE SAME

CROSS-REFERENCE TO RELATED APPLICATIONS

This application claims priority under 35 U.S.C. § 119 to Korean Patent Application No. 10-2021-0163833, filed on Nov. 24, 2021, in the Korean Intellectual Property Office, the disclosure of which is incorporated herein by reference in its entirety.

TECHNICAL FIELD

The following disclosure relates to a battery management system capable of preventing damage to a battery, and a method of managing a battery using the same.

BACKGROUND

Hybrid vehicles, electric vehicles, or the like, are provided with batteries such as nickel hydride batteries or lithium ion batteries. Such a vehicle is provided with a battery management system (BMS) in order to prevent damage to the battery in charging and discharging processes of the battery and manage a lifespan of the battery.

When an error such as an overcurrent or an overvoltage occurs at the time of charging the battery, the BMS perform diagnosis and detection of the error for a predetermined time. When the diagnosis and the detection of the error by the BMS are completed, a relay of the battery is cut off by a fuse provided in the vehicle.

However, even after the error occurs, an overcurrent or overvoltage state continues for the predetermined time for the purpose of the diagnosis and the detection of the error by the BMS, which causes damage to the battery. In a case where the battery is repeatedly damaged, it affects stability of a battery cell.

In addition, in a case where the overcurrent or the overvoltage instantaneously occurs, the relay of the battery is not cut off by the fuse, such that stress is generated in the battery and is accumulated.

SUMMARY

The present invention has been made in order to solve the problems as described above.

An object of the present invention is to prevent damage to a battery due to an overcurrent or an overvoltage while a battery management system (BMS) diagnoses a failure of the battery.

Another object of the present invention is to prevent damage to a battery due to an overcurrent or an overvoltage that instantaneously occurs in the battery.

Objects of the present invention are not limited to the objects mentioned above, and other objects that are not mentioned may be obviously understood by those skilled in the art from the following description.

In one general aspect, a battery management system includes: a battery management system (BMS) monitoring a battery, turning on/off a main relay connected to an output of the battery, and receiving power through a power switch; a sensor unit measuring a state of the battery to generate battery state information; and a controller configured to receive the battery state information from the sensor unit, detect an occurrence of a failure event of the battery based on the battery state information, control the main relay based on a maintenance time of the failure event and the number of times of the occurrence of the failure event, and provide a turn on/off command to the power switch.

The battery state information may include at least one of voltage information, current information, and temperature information of the battery.

The controller may determine that the failure event has occurred when a measured voltage of the battery exceeds a reference voltage $V_{max}$ or a measured temperature of the battery exceeds a reference temperature $T_{max}$.

When the maintenance time of the failure event is longer than a reference time $T_{1d}$, the controller may diagnose the failure event and determine whether or not the battery is abnormal for a predetermined time $T_2$.

The controller may turn off the main relay when the predetermined time $T_2$ is longer than a reference time $T_{2th}$ greater than $T_{1a}$.

In a case where the predetermined time $T_2$ is equal to or shorter than a reference time $T_{2th}$ greater than $T_{1d}$, when a current of the battery is I0 that is a predetermined reference, the controller may provide a turn-off command to the power switch.

In a case where the predetermined time $T_2$ is equal to or shorter than a reference time $T_{2th}$ greater than $T_{1d}$, when a current of the battery is greater than I0 that is a predetermined reference, the controller may turn off the main relay, and provide a turn-on maintenance command to the power switch.

The controller may accumulatively increase a stress index of the battery when the failure event occurs, and may turn off the main relay when a duration of the failure event is equal to or shorter than a reference time $T_{1a}$ and the stress index of the battery is greater than a reference set value $S_{th}$.

The controller may determine that the failure event has occurred when a measured voltage of the battery exceeds a reference voltage $V_{max}$ or a measured temperature of the battery exceeds a reference temperature $T_{max}$, and the stress index of the battery may be a count value of the number of times the measured voltage of the battery exceeds the reference voltage $V_{max}$ or the measured temperature of the battery exceeds the reference temperature $T_{max}$.

The controller may determine that the failure event has occurred when a measured voltage of the battery exceeds a reference voltage $V_{max}$ or a measured temperature of the battery exceeds a reference temperature $T_{max}$, and the stress index of the battery may be a degree to which the measured voltage of the battery exceeds the reference voltage $V_{max}$ or a degree to which the measured temperature of the battery exceeds the reference temperature $T_{max}$.

In another general aspect, a method of managing a battery using a battery management system (BMS) monitoring the battery, turning on/off a main relay connected to an output of the battery, and receiving power through a power switch includes: measuring battery state information, detecting an occurrence of a failure event of the battery based on the battery state information, controlling the main relay based on a maintenance time of the failure event and the number of times of the occurrence of the failure event, and turning on/off the power switch.

The battery state information may include at least one of voltage information, current information, and temperature information of the battery.

It may be determined that the failure event has occurred when a measured voltage of the battery exceeds a reference voltage $V_{max}$ or a measured temperature of the battery exceeds a reference temperature $T_{max}$.

The method may further include: accumulatively increasing a stress index of the battery when the failure event occurs, and turning off the main relay when a duration of the failure event is equal to or shorter than a reference time $T_{1a}$ and the stress index of the battery is greater than a reference set value $S_{th}$.

The method may further include: when the maintenance time of the failure event is longer than a reference time $T_{1d}$, diagnosing the failure event, and determining whether or not the battery is abnormal for a predetermined time $T_2$.

The method may further include turning off the main relay when the predetermined time $T_2$ is longer than a reference time $T_{2th}$ greater than $T_{1a}$.

The method may further include: in a case where the predetermined time $T_2$ is equal to or shorter than a reference time $T_{2th}$ greater than $T_{1d}$, when a current of the battery is I0 that is a predetermined reference, turning off the power switch, and when the current of the battery is longer than I0 that is the predetermined reference, turning off the main relay and maintaining turn-on of the power switch.

DETAILED DESCRIPTION OF MAIN ELEMENTS

Figure 1:
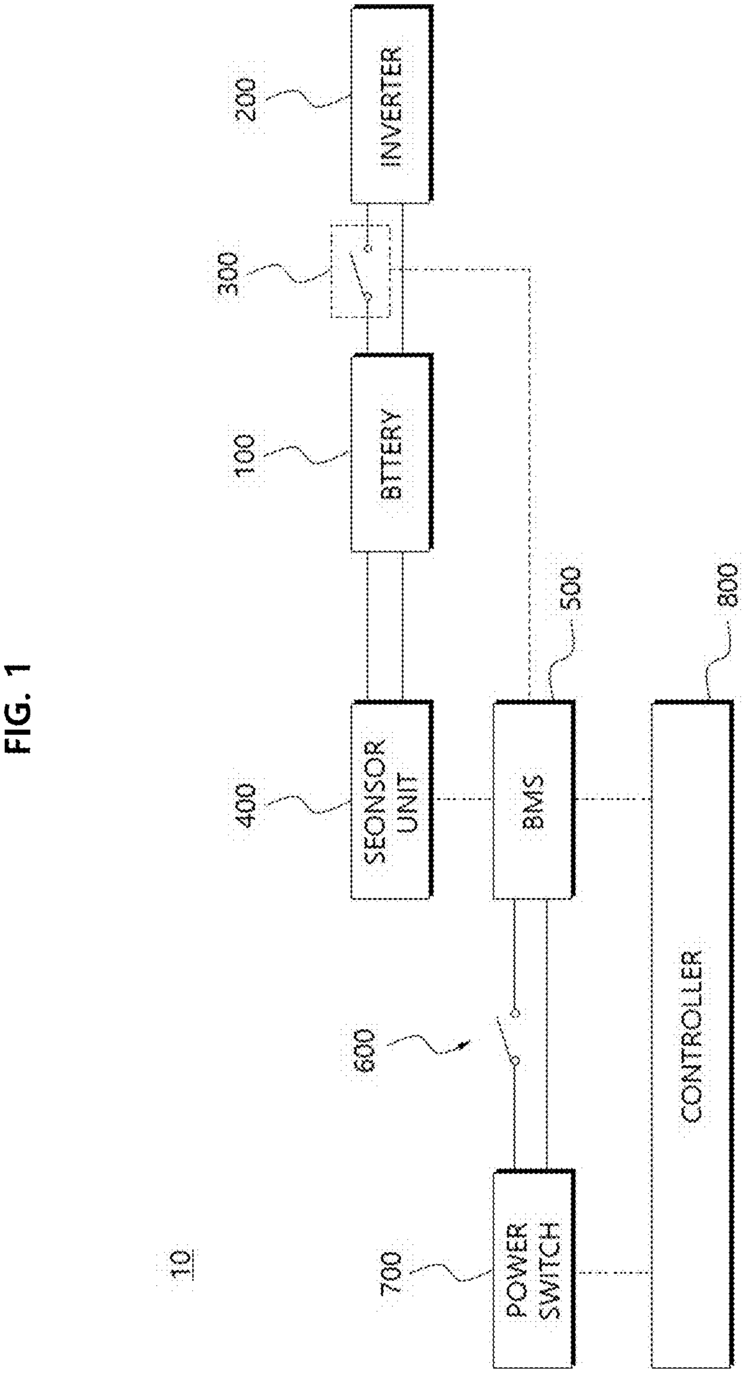
FIG. 1 is a schematic block diagram illustrating a battery management system according to an embodiment of the present invention.

10: battery management system
100: battery
300: main relay
400: sensor unit
500: BMS
700: power switch
800: controller

DETAILED DESCRIPTION OF EMBODIMENTS

Hereinafter, exemplary embodiments of the present invention will be described in detail with reference to the accompanying drawings. In describing the present invention, when it is determined that a detailed description of a related known configuration or function may obscure the gist of the present invention, the detailed description will be omitted. In addition, although exemplary embodiments of the present invention will be described below, the scope of the present invention is not limited thereto, and may be variously modified by those skilled in the art.

FIG. 1 is a schematic block diagram illustrating a battery management system 10 according to an embodiment of the present invention. The battery management system 10 is provided in order to monitor a battery provided in a vehicle. Referring to FIG. 1, the battery management system 10 includes a battery 100, an inverter 200, a sensor unit 400, a battery management system (BMS) 500, a power switch 700, and a controller 800.

The battery 100 is a battery provided in a vehicle such as a hybrid vehicle, an electric vehicle, or a hydrogen fuel cell vehicle. In an example, the battery 100 may be a secondary battery such as a nickel hydride battery or a lithium ion battery. In an example, the battery 100 may be a battery pack configured in the form of one pack by connecting cells to each other in series according to a required capacity. The inverter 200 converts direct current (DC) power of the battery into alternating current (AC) power for driving a motor.

The sensor unit 400 measures a state of the battery 100 to generate battery state information. In an example, the battery state information may include at least one of voltage information, current information, and temperature information of the battery 100. In an example, the sensor unit 400 includes a voltage sensor measuring a voltage of the battery 100, a current sensor measuring a current of the battery 100, and a temperature sensor measuring a temperature of the battery 100.

The BMS 500 turns on/off a main relay 300 connected to an output of the battery 100, and receives power through the power switch 700. In addition, the BMS 500 monitors the state of the battery 100. In an example, the BMS 500 operates all the time while the vehicle is driving, and operates for charging (direct charging by a charger, a solar system, etc.) while the vehicle is not driving. The BMS 500 operates all the time in order to prevent ignition, explosion or the like of the battery 100 at the time of charging and discharging of the battery 100. The BMS 500 operates in a state in which the vehicle is started. The BMS 500 receives the battery state information from the sensor unit 400, and controls turn-on/off of the main relay 300 based on the received battery state information.

In addition, the BMS 500 may be implemented to calculate a state of charge (SOC) of the battery 100 for prediction of a travelable distance of the vehicle, predict a state of health estimation (SOH) for replacement of the battery 100, perform an alarm and prior safety protection for safe operation of a battery system, perform diagnosis of the battery system, or maintain an optimum temperature of the battery 100 through control of a cooling fan.

The controller 800 is configured to be able to communicate with the BMS 500. The controller 800 receives the battery state information from the sensor unit 400, and controls the main relay 300 and the power switch 700. In an example, the controller 800 is configured to communicate with the sensor unit 400 through the BMS 500. Optionally, the controller 800 is configured to be able to communicate directly with the sensor unit 400. The controller 800 may detect the occurrence of a failure event of the battery 100 based on the battery state information, control the main relay 300 based on a maintenance time of the failure event and the number of times of the occurrence of the failure event, and provide a turn on/off command to the power switch.

Figure 2:
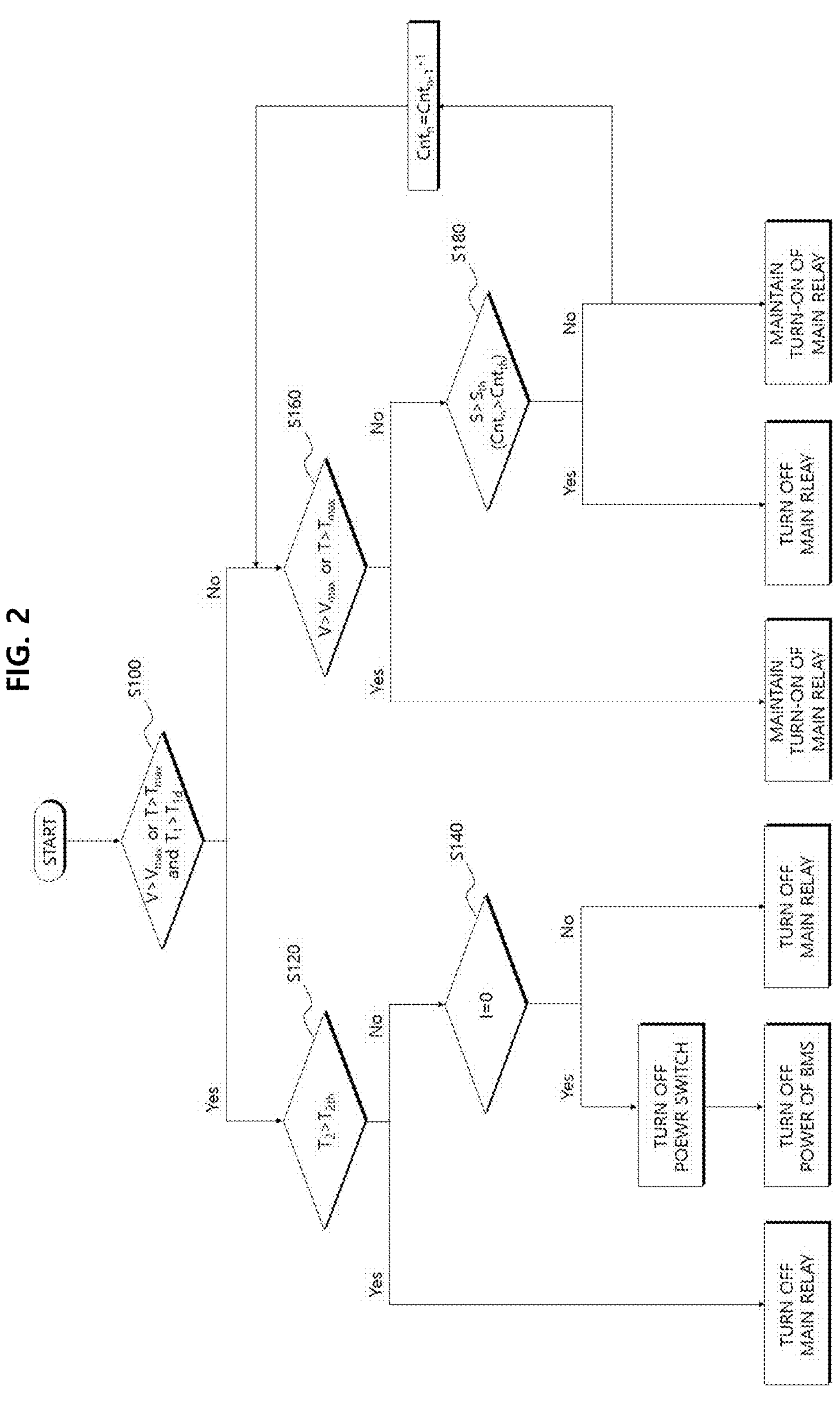
FIG. 2 is a flowchart illustrating a flow of a method of managing a battery according to an embodiment of the present invention.

Hereinafter, a method of managing a battery according to the present invention will be described in detail with reference to FIG. 2.

While the vehicle is started, the controller 800 continuously determines whether or not a failure event has occurred in the battery 100. In an example, the controller 800 determines whether or not a measured voltage of the battery 100 exceeds a reference voltage $V_{max}$ ($V>V_{max}$) or a measured temperature of the battery 100 exceeds a reference temperature $T_{max}$ ($T>T_{max}$) and whether or not the battery 100 is in a normal state on the basis of the maintenance time $T_1$ of the failure event. In a case where the measured voltage V of the battery 100 exceeds the reference voltage $V_{max}$ or the measured temperature T of the battery 100 exceeds the reference temperature $T_{max}$, and a time $T_1$ for which the failure event occurs and continues is longer than a reference time $T_{1d}$, the controller 800 determines that the battery 100 is in an abnormal state (S100).

First, a case where it is determined that the battery 100 is in an abnormal state will be described. When maintenance time $T_1$ of the failure event is longer than the reference time $T_{1d}$, the BMS 500 diagnoses the failure event and determines whether or not the battery is abnormal for a predetermined time $T_2$. The controller 800 determines whether or not the time $T_2$ is longer than a reference time $T_{2th}$ (S120).

The controller 800 causes the BMS 500 to turn off the main relay 300 when $T_2$ is longer than the reference time $T_{2th}$. In this case, a value of $T_{2th}>T_{1d}$ is provided. This prevents a time for which the BMS 500 diagnoses the failure event from becoming excessive long by turning off the main relay 300 when a predetermined time elapses after the failure event has occurred. Accordingly, a phenomenon in which the battery 100 is damaged or is ignited or exploded due to an overvoltage, an overtemperature or the like while the BMS 500 detects and diagnoses the failure event for a long time may be prevented.

The controller 800 determines a current value of the battery 100 (S140) in a case where $T_2$ is equal to or shorter than the reference time $T_{2th}$. When a current of the battery 100 is I0, which is a predetermined reference, the controller 800 may provide a turn-off command to the power switch 700. In an example, I0 is a case where a current value of the current flowing through the battery 100 is 0. In a case where the current value of the current flowing through the battery 100 is 0, the controller 800 turns off the power switch 700. Accordingly, power of the BMS 500 is turned off. The controller 800 turns off the power switch 700 itself, and thus, a problem occurring because a current is passed to the battery 100 and other components connected to the BMS 500 is prevented.

In a case where $T_2$ is equal to or shorter than the reference time $T_{2th}$, the controller 800 may turn off the main relay 300 and provide a turn-on maintenance command to the power switch 700 when the current of the battery 100 is greater than I0, which is the predetermined reference. In an example, a case where the current of the battery 100 is greater than I0 is a case where the current value of the battery 100 exceeds 0.

Next, a case where it is determined that the battery 100 is in a normal state will be described. When a condition in which the measured voltage of the battery 100 exceeds the reference voltage $V_{max}$ or the measured temperature of the battery 100 exceeds the reference temperature $T_{max}$ and a condition in which a time $T_1$ for which the failure event occurs and continues is longer than the reference time $T_{1d}$ are not satisfied, the controller 800 determines that the battery 100 is in a normal state (S100).

In a case where it is determined that the battery 100 is in the normal state, it is first determined whether or not the failure event has occurred. Whether or not the failure event has occurred is determined on the basis of whether or not the measured voltage of the battery 100 exceeds the reference voltage $V_{max}$ ($V>V_{max}$) or the measured temperature of the battery 100 exceeds the reference temperature $T_{max}$ ($T>T_{max}$) (S160). A case where the failure event has occurred is a case where the measured voltage of the battery 100 exceeds the reference voltage $V_{max}$ ($V>V_{max}$) or the measured temperature of the battery 100 exceeds the reference temperature $T_{max}$ ($T>T_{max}$).

In a case where the failure event has not occurred, the controller 800 issues a maintenance command to the BMS 500 so that the main relay 300 may be maintained.

In a case where the failure event has occurred, the controller 800 determines whether or not a stress index S of the battery 100 is greater than a reference set value $S_{th}$. In a case the stress index S of the battery 100 is greater than the reference set value $S_{th}$, the controller 800 turns off the main relay 300. In a case where the stress index S of the battery 100 is not greater than the reference set value $S_{th}$, the controller 800 maintains a turn-on state of the main relay 300, but accumulatively increases the stress index of the battery 100.

In an example, the stress index S of the battery 100 is a count value Cntn of the number of times the measured voltage of the battery 100 exceeds the reference voltage $V_{max}$ or the measured temperature of the battery 100 exceeds the reference temperature $T_{max}$, and the reference value $S_{th}$ may be a reference count value $Cnt_{th}$. Accordingly, as illustrated in FIG. 2, when a value $Cnt_n$ is greater than the reference value $Cnt_{th}$, the controller 800 turns off the main relay 300.

Alternatively, the stress index S of the battery may be provided as a degree to which the measured voltage of the battery 100 exceeds the reference voltage $V_{max}$ or a degree to which the measured temperature of the battery 100 exceeds the reference temperature $T_{max}$. Alternatively the stress index of the battery 100 may be provided as another condition that may adversely affect the battery 100 in a case where the number of times of occurrences is accumulated. An accumulatively increased value may be initialized by a user or may be initialized in a case where a specific condition is satisfied by a separate logic.

In a case where the value $Cnt_n$ is not greater than the reference value $Cnt_{th}$, the controller 800 issues a maintenance command to the BMS 500 so that the main relay 300 may be maintained in the turn-on state. In addition, a count value is accumulated.

Therefore, even though a duration of the failure event is equal to or shorter than the reference time $T_{1d}$, when the stress index S of the battery 100 is greater than the reference set value $S_{th}$, the main relay 300 is turned off, such that a phenomenon in which an effect of an overvoltage or an overtemperature that occurs instantaneously is accumulated to damage to the battery 100 may be prevented.

According to an embodiment of the present invention, it is possible to prevent damage to a battery due to an overcurrent or an overvoltage while a BMS diagnoses a failure of the battery.

According to an embodiment of the present invention, it is possible to prevent damage to a battery due to an overcurrent or an overvoltage that instantaneously occurs in the battery.

Meanwhile, effects of the present invention are not limited to the above-mentioned effects, and various effects may be included within the range apparent to those skilled in the art from a description to be described later.

The technical spirit of the present invention has been described only by way of example hereinabove, and the present invention may be variously modified, altered, and substituted by those skilled in the art to which the present invention pertains without departing from essential features of the present invention. Accordingly, embodiments disclosed in the present invention and the accompanying drawings do not limit but describe the spirit of the present invention, and the scope of the present invention is not limited by these embodiments and accompanying drawings. The scope of the present invention should be interpreted by the following claims, and it should be interpreted that all spirits equivalent to the following claims fall within the scope of the present invention.

What is claimed is:

1. A battery management system comprising:

a battery management system (BMS) monitoring a battery, turning on/off a main relay connected to an output of the battery, and receiving power through a power switch;

a sensor unit measuring a state of the battery to generate battery state information; and a controller configured to: receive the battery state information from the sensor unit, detect an occurrence of a failure event of the battery based on the battery state information, control the main relay based on whether a maintenance time of the failure event being longer than a reference time $T_{1d}$ and whether the number of times of the occurrence of the failure event being greater than a reference set value $S_{th}$, and provide a turn on/off command to the power switch, wherein the controller accumulatively increases a stress index of the battery when the failure event occurs, and turns off the main relay when a duration of the failure event is equal to or shorter than $T_{1d}$ and the stress index of the battery is greater than $S_{th}$.

2. The battery management system of claim 1, wherein the battery state information includes at least one of voltage information, current information, and temperature information of the battery.

3. The battery management system of claim 1, wherein the controller determines that the failure event has occurred when a measured voltage of the battery exceeds a reference voltage $V_{max}$ or a measured temperature of the battery exceeds a reference temperature $T_{max}$.

4. The battery management system of claim 1, wherein when the maintenance time of the failure event is longer than $T_{1d}$, the controller diagnoses the failure event and determines whether or not the battery is abnormal for a predetermined time $T_2$.

5. The battery management system of claim 4, wherein the controller turns off the main relay when the predetermined time $T_2$ is longer than a reference time $T_{2th}$ greater than $T_{1d}$.

6. The battery management system of claim 4, wherein in a case where the predetermined time $T_2$ is equal to or shorter than a reference time $T_{2th}$ greater than $T_{1d}$, when a current of the battery is I0 that is a predetermined reference, the controller provides a turn-off command to the power switch.

7. The battery management system of claim 4, wherein in a case where the predetermined time $T_2$ is equal to or shorter than a reference time $T_{2th}$ greater than $T_{1d}$, when a current of the battery is greater than 10 that is a predetermined reference, the controller turns off the main relay, and provides a turn-on maintenance command to the power switch.

8. The battery management system of claim 1, wherein the controller determines that the failure event has occurred when a measured voltage of the battery exceeds a reference voltage $V_{max}$ or a measured temperature of the battery exceeds a reference temperature $T_{max}$, and the stress index of the battery is a count value of the number of times the measured voltage of the battery exceeds the reference voltage $V_{max}$ or the measured temperature of the battery exceeds the reference temperature $T_{max}$.

9. The battery management system of claim 1, wherein the controller determines that the failure event has occurred when a measured voltage of the battery exceeds a reference voltage $V_{max}$ or a measured temperature of the battery exceeds a reference temperature $T_{max}$, and the stress index of the battery is a degree to which the measured voltage of the battery exceeds the reference voltage $V_{max}$ or a degree to which the measured temperature of the battery exceeds the reference temperature $T_{max}$.

10. A method of managing a battery using a battery management system (BMS) monitoring the battery, turning on/off a main relay connected to an output of the battery, and receiving power through a power switch, comprising:

measuring battery state information;

detecting an occurrence of a failure event of the battery based on the battery state information;

controlling the main relay based on whether a maintenance time of the failure event being longer than a reference time $T_{1d}$ and whether the number of times of the occurrence of the failure event being greater than a reference set value $S_{th}$; and turning on/off the power switch; and accumulatively increasing a stress index of the battery when the failure event occurs, and turning off the main relay when a duration of the failure event is equal to or shorter than $T_{1d}$ and the stress index of the battery is greater than $S_{th}$.

11. The method of managing a battery of claim 10, wherein the battery state information includes at least one of voltage information, current information, and temperature information of the battery.

12. The method of managing a battery of claim 10, wherein it is determined that the failure event has occurred when a measured voltage of the battery exceeds a reference voltage $V_{max}$ or a measured temperature of the battery exceeds a reference temperature $T_{max}$.

13. The method of managing a battery of claim 10, further comprising: when the maintenance time of the failure event is longer than a reference time $T_{1d}$, diagnosing the failure event and determining whether or not the battery is abnormal for a predetermined time $T_2$.

14. The method of managing a battery of claim 13, further comprising turning off the main relay when the predetermined time $T_2$ is longer than a reference time $T_{2th}$ greater than $T_{1d}$.

15. The method of managing a battery of claim 13, further comprising: in a case where the predetermined time $T_2$ is equal to or shorter than a reference time $T_{2th}$ greater than $T_{1d}$, when a current of the battery is I0 that is a predetermined reference, turning off the power switch, and when the current of the battery is greater than I0 that is the predetermined reference, turning off the main relay and maintaining turn-on of the power switch.

* * * * *